(12) United States Patent
Behfar et al.

(10) Patent No.: US 7,598,527 B2
(45) Date of Patent: Oct. 6, 2009

(54) MONITORING PHOTODETECTOR FOR INTEGRATED PHOTONIC DEVICES

(75) Inventors: Alex A. Behfar, Ithaca, NY (US); Cristian B. Stagarescu, Ithaca, NY (US); Malcolm R. Green, Ithaca, NY (US); Alfred T. Schremer, Jr., Freeville, NY (US)

(73) Assignee: Binoptics Corporation, Ithaca, NY (US)

( * ) Notice: Subject to any disclaimer, the term of this patent is extended or adjusted under 35 U.S.C. 154(b) by 0 days.

(21) Appl. No.: 11/325,325

(22) Filed: Jan. 5, 2006

(65) Prior Publication Data

US 2006/0118893 A1      Jun. 8, 2006

Related U.S. Application Data

(63) Continuation-in-part of application No. 11/037,334, filed on Jan. 19, 2005.

(60) Provisional application No. 60/537,248, filed on Jan. 20, 2004, provisional application No. 60/618,134, filed on Oct. 14, 2004.

(51) Int. Cl.
*H01L 29/161* (2006.01)

(52) U.S. Cl. ............... 257/85; 257/E33.076; 257/80; 372/50.1; 372/50.12; 372/50.122; 372/50.21

(58) Field of Classification Search ............... 372/50.1, 372/50.12, 50.122, 50.21; 257/80, 86, E33.076
See application file for complete search history.

(56) References Cited

U.S. PATENT DOCUMENTS

| | | | |
|---|---|---|---|
| 4,692,207 A * | 9/1987 | Bouadma et al. | 438/24 |
| 4,750,486 A | 6/1988 | Butler et al. | |
| 4,851,368 A | 7/1989 | Behfar-Rad et al. | |
| 4,956,844 A | 9/1990 | Goodhue et al. | |
| 5,032,879 A | 7/1991 | Buchmann et al. | |
| 5,113,404 A | 5/1992 | Gaebe et al. | |
| 5,282,080 A | 1/1994 | Scifres et al. | |
| 5,604,628 A * | 2/1997 | Parker et al. | 359/344 |
| 5,793,790 A | 8/1998 | Doi et al. | |

(Continued)

FOREIGN PATENT DOCUMENTS

KR      2001054750      *   7/2001

OTHER PUBLICATIONS

Langley et al. "Effect of optical feedback on noise properties of vertical cavity surface emitting lasers," IEE Proc-Opto. vol. 144 p. 34-38 1997.*

(Continued)

*Primary Examiner*—Davienne Monbleau
*Assistant Examiner*—Matthew Reames
(74) *Attorney, Agent, or Firm*—Jones, Tullar & Cooper, P.C.

(57) ABSTRACT

A laser and detector integrated on corresponding epitaxial layers of a single chip cooperate with on-chip and/or external optics to couple light of a first wavelength emitted by the laser to a single external device such as an optical fiber and to simultaneously couple light of a different wavelength received from the external device to the detector to provide bidirectional photonic operation. Multiple lasers and detectors may be integrated on the chip to provide multiple bidirectional channels. A monitoring photodetector is fabricated in the detector epitaxy adjacent one end of the laser.

15 Claims, 12 Drawing Sheets

U.S. PATENT DOCUMENTS

| | | | |
|---|---|---|---|
| 6,487,225 | B2 | 11/2002 | Okubo |
| 6,580,741 | B2 * | 6/2003 | Jiang et al. ............... 372/50.11 |
| 6,611,544 | B1 | 8/2003 | Jiang et al. |
| 6,703,644 | B1 | 3/2004 | Lell |
| 6,730,990 | B2 * | 5/2004 | Kondo et al. ................ 257/623 |
| 6,839,365 | B1 | 1/2005 | Sonoda et al. |
| 2001/0000209 | A1 * | 4/2001 | Krames et al. ................ 257/94 |
| 2002/0034200 | A1 * | 3/2002 | Wickman ............... 372/29.02 |
| 2004/0085601 | A1 | 5/2004 | Swartz et al. |

OTHER PUBLICATIONS

Behfar-Rad and Wong, "Monolithic AlGaAs-GaAs Single Quantum-Well Ridge Lasers Fabricated with Dry-Etched Facets and Ridges," IEEE Journal of Quantum Electronics, vol. 28 (No. 5), p. 1227-1231, May 1992.

Product Brochure, "Positive Tone Photosensitive Polyimide Coating", Dow Corning Corporation, 2001.

* cited by examiner

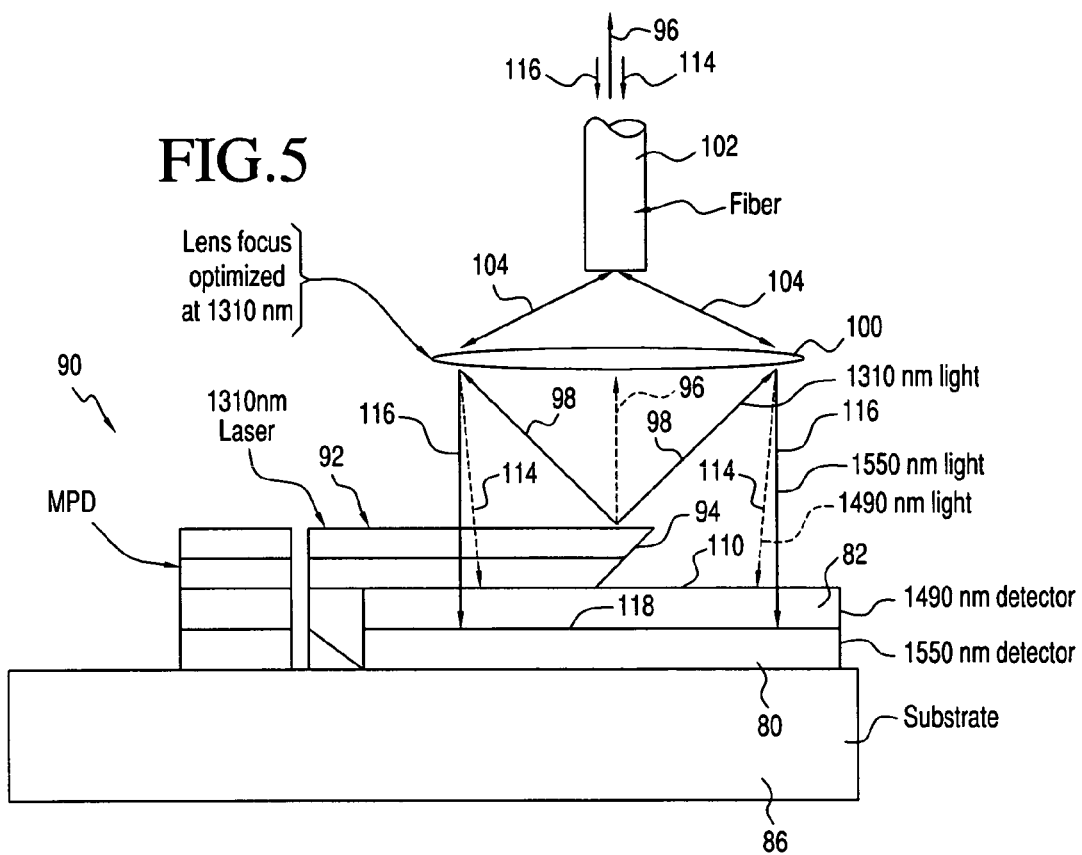
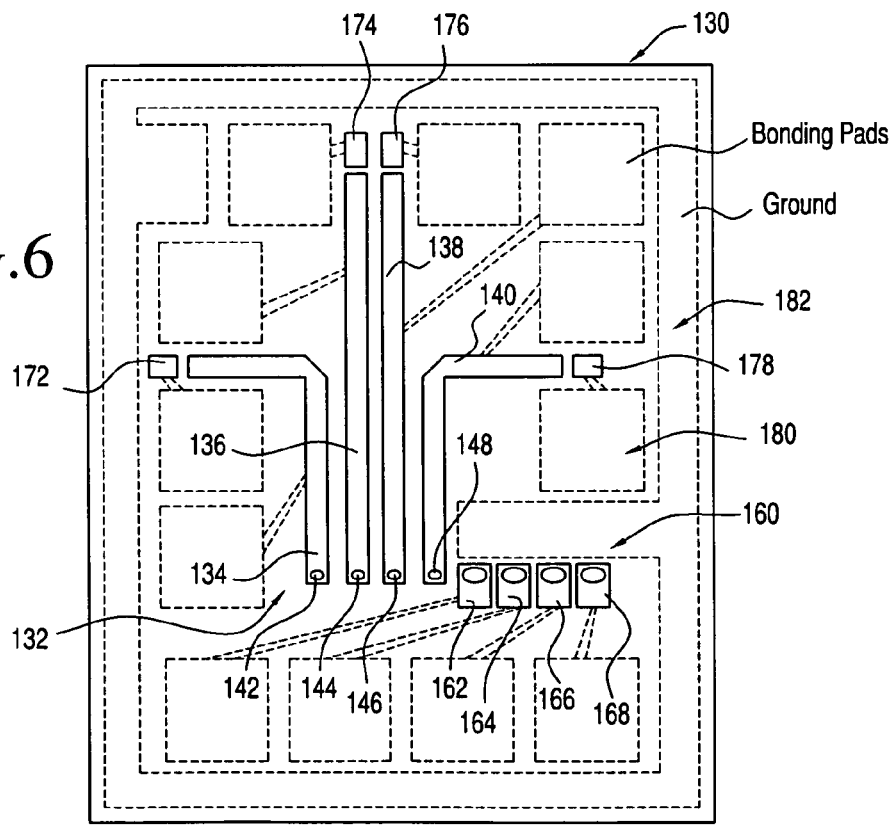

MONITORING PHOTODETECTOR FOR INTEGRATED PHOTONIC DEVICES

This application is a Continuation-in-Part of copending U.S. application Ser. No. 11/037,334, filed Jan. 19, 2005, and entitled "Integrated Photonic Devices," claims the benefit of U.S. Provisional Patent Application No. 60/537,248, filed Jan. 20, 2004, and claims the benefit of U.S. Provisional Patent Application No. 60/618,134, filed Oct. 14, 2004, the disclosures of all of which are hereby incorporated herein by reference.

BACKGROUND OF THE INVENTION

The present invention relates, in general, to photonic devices, and more particularly to improve monolithically integrated photonic devices incorporating monitoring photodetectors and methods for fabricating them.

Many optical systems, such as, for example, those incorporating or utilizing Passive Optical Networks (PON), require that a single optical fiber be used for both sending and receiving information at multiple wavelengths. In the past, such a capability has been difficult to achieve, particularly in a cost-effective manner, for the combination of a multiplicity of discrete photonic devices that will all have access to a single fiber has presented fabrication problems that have made such arrangements too expensive. The market for PON systems is extremely price sensitive, with the result that the highly desirable, wide range of functions that such networks can make available have not been economically feasible. Similar difficulties have been encountered with the use of multiple photonic devices in other optical systems, such as high definition DVD's, for even in such applications the required high level of functionality is not easily attainable through the use of discrete photonic devices.

Because photonic devices such as lasers tend to change their characteristics with changing environmental conditions, it is desirable to monitor their operation, but such monitoring is not easily achievable when using discrete devices, particularly when the devices are extremely small.

SUMMARY OF THE INVENTION

In accordance with one aspect of the present invention, solid state light receiving and light emitting photonic devices are monolithically integrated on a common substrate to provide multiple optical functions on the surface of a single chip. The integration of such devices to provide bidirectional photonic operation is optimized though multilayer epitaxy, wherein lasers and detectors can be fabricated on separate mesas on a single chip to provide a high efficiency coupling of the lasers and the detectors to a single optical fiber. In accordance with another aspect of the invention, multiple light emitters and multiple light detectors are fabricated on a single chip in such a way as to permit coupling of multiple emitters and multiple detectors to a single fiber. The emitters may be surface emitting devices fabricated on the surface of the chip, such as those described in U.S. application Ser. No. 10/958,069, filed Oct. 5, 2004, or in application Ser. No. 10/963,739, filed Oct. 14, 2004, the disclosures of which are hereby incorporated herein by reference, or may be edge emitting lasers fabricated on the chip, such as those described in U.S. Pat. No. 4,851,368, or in IEEE Journal of Quantum Electronics, volume 28, pages 1227-1231, May 1992, with all of the laser outputs being coupled into a common optical fiber. The detectors are also fabricated on the same chip, and may be surface or edge-receiving devices coupled to the same optical fiber to receive optical signals from the fiber. In a preferred form of the invention each of the lasers emits light at a different wavelength and each of the detectors receives light at different wavelengths that differ from those of the emitted light.

In accordance with another aspect of the invention, solid state light emitting and receiving photonic devices such as lasers and light detectors are monolithically integrated on a common substrate, as described above, and further incorporate at least one monitoring detector positioned to receive light from a corresponding light emitter on the substrate. The monitoring detector may be fabricated integrally on the substrate, and may be axially aligned with the emitter or in the preferred form of the invention, may be a surface-receiving detector having a suitable deflector directing light from the emitter to the detector.

Briefly, in its preferred form, the invention incorporates one or more photonic devices including laser emitters and photodetectors and one or more corresponding semiconductor monitoring detector structures fabricated on a single chip. The photonic devices are fabricated in a semiconductor structure that is deposited epitaxially in superimposed layers on a substrate, and includes at least one epitaxially deposited detector structure with an emitter structure epitaxially deposited on the top detector structure. The structures are etched to form one or more emitter mesas incorporating surface or edge emitting lasers to direct emitted light to an optical fiber, and to form one or more photo detector mesas incorporating surface or edge receiving detectors for receiving light from the optical fiber, and surface or edge receiving monitoring detectors for receiving light from the emitter. Reflectors, deflectors, prisms, gratings or other diffraction elements, hoods and/or lenses may also be fabricated integrally on the substrate or located adjacent to the chip to direct emitted or received light as required.

In one form of the invention, a monolithically integrated photonic chip includes a substrate carrying a semiconductor detector epitaxial structure, with a semiconductor laser structure epitaxially deposited on the detector structure, using known deposition techniques. A horizontal cavity surface-emitting laser (HCSEL) is fabricated, as by etching, in the emitter structure, and is surrounded by an isolating trench, formed, for example, by etching through the detector structure to the substrate. The surface of the detector structure adjacent the laser is exposed, as by etching away the covering laser structure, to form a detector receiver surface which surrounds the emitting end of the laser and is spaced from it by the trench, so that the laser and the detector form separate mesas on the common substrate. A metal layer on the surface of the laser provides an electrical contact for application of a suitable bias voltage to the laser structure to produce laser light of a known wavelength. The surface emitting laser acts as a light source, directing a beam of light upwardly through an external lens to an external optical fiber. The fiber also may direct light of a second wavelength toward the chip, with this received light passing downwardly through the lens. Since the received light is of a different wavelength than the light emitted by the laser, the lens will not focus the received light back into the laser, but incoming light will be directed by the lens toward the region surrounding the laser source, where it is received by the detector structure.

In another embodiment of the invention, the monolithically integrated chip includes two superimposed epitaxially deposited detector structures, with a single emitter layer superimposed on the top detector structure. A surface emitting laser is fabricated on a mesa formed in the laser structure on the chip, as by etching, and is isolated from a surrounding detector mesa by a trench. The emitter layer surrounding the laser mesa is then removed from the surface of the surrounding two-structure detector mesa. The laser may be energized to emit light of a first wavelength which may be directed to an optical fiber through a lens, as discussed above. In this embodiment, however, the two detector structures are capable of receiving light of second and third wavelengths, respectively, from the optical fiber. The provision of a detector mesa around the emitter end and along the sides of a surface-emitting laser to substantially surround the emitter end of the laser optimizes the bidirectional coupling of the laser and detectors to a single optical fiber. The first detector can be designed to absorb wavelengths corresponding to the laser output, thereby enhancing the optical isolation between the laser and the second detector.

In yet another embodiment of the invention, a photonic chip incorporates a surface-emitting laser at one end of the chip and includes a surface-receiving detector at the other end of the chip. External components may be used with this photonic chip to allow light from the laser to be coupled to a fiber, while light from the same fiber can be directed to the surface-receiving detector or to multiple surface-receiving detectors.

In still another embodiment of the invention, a multiplicity of surface-emitting lasers may be fabricated side-by-side on individual mesas in a laser structure array on a chip, with each laser in the array emitting light of a different wavelength. In similar fashion, a multiplicity of individual detectors may be fabricated side-by-side on individual mesas in the detector structure, with each detector being capable of receiving light of a distinct wavelength. The emitters and detectors may be optically coupled to a single optic fiber through an external diffraction element such as a prism, and a suitable lens if required.

Edge-emitting lasers and either surface-receiving or edge-receiving detectors may also be utilized in the fabrication of the monolithically integrated bidirectional photonic device of the invention. In one such embodiment, an edge-emitting laser is fabricated on a mesa in a laser structure and a reflector is fabricated, for example in the laser structure adjacent the laser exit facet, to direct emitted light of a first wavelength vertically upwardly. The reflector may incorporate a flat or a curved reflector surface to direct the light upwardly through an external lens to an optical fiber. The reflector is surrounded by an exposed surface-receiving detector structure which is on a mesa separate from the laser mesa and which receives light of a second wavelength from the optical fiber. In another embodiment, the reflector surface includes a dichroic coating which reflects laser light of the first wavelength, but which passes received light of the second wavelength through the reflector body to the underlying detector structure or structures.

A multiplicity of edge-emitting lasers may be fabricated in an array in the laser structure on the chip to direct light of corresponding wavelengths by way of a diffraction element such as a prism or grating to an external optical fiber. The array may also include a multiplicity of end receiving detectors fabricated on separate mesas in the detector structure and arranged to receive light of different frequencies from the optical fiber, thus providing a monolithically integrated array of laser and detector channels, in accordance with the invention.

In the foregoing embodiments, each of the laser devices may be provided with a monitoring photodetector (MPD) to detect the intensity of the light produced by its corresponding laser. The MPD may be fabricated in the laser epitaxial layer in alignment with the optical axis of the laser, or may be fabricated as surface-receiving detector in the detector epitaxial layer. In the latter case, a suitable light deflector, or hood, may be provided to direct emitted laser light onto the surface of the MPD.

BRIEF DESCRIPTION OF THE DRAWINGS

The foregoing, and additional objects, features and advantages of the invention will become evident from the following detailed description of preferred embodiments thereof, taken with the accompanying drawings, in which:

FIG. 5 is a side elevation view of a monolithically integrated photonic device including a surface-emitting laser fabricated in the laser structure and two surface-receiving detectors fabricated in the detector structures of the chip of FIG. 4, in accordance with another embodiment of the invention;

FIG. 6 is a top plan view of a monolithically integrated photonic device incorporating an array of surface-emitting lasers and an array of surface-receiving detectors in corresponding laser and detector epitaxial structures on a common chip in accordance with another embodiment of the invention;

DESCRIPTION OF PREFERRED EMBODIMENTS

Figure 1:
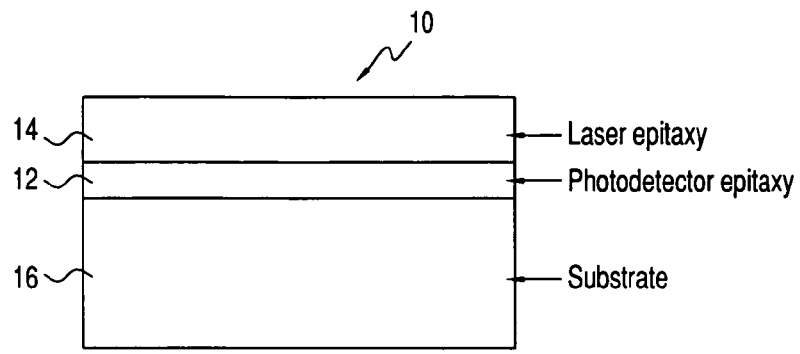
FIG. 1 illustrates a two-layer epitaxial chip structure including a laser epitaxial structure and a detector epitaxial structure on a substrate.

Turning now to a more detailed description of the invention, there is illustrated in FIG. 1 a two-layer epitaxial chip 10 incorporating first and second epitaxial layers, or structures 12 and 14 superimposed on each other and on a substrate 16. The first structure 12 is a semiconductor material that is epitaxially deposited in conventional manner on a substrate to form a photodetector sensitive to light of a selected wavelength band. The second structure 14 is another semiconductor material that is epitaxially deposited on the first structure 12, again in conventional manner. This second structure incorporates an active region, from which a laser can be fabricated.

As is known in the art, the structures on the substrate 16 may be formed, for example, from a suitably doped type III-V compound, or an alloy thereof. Structure 12 may be a succession of layers deposited by an epitaxial deposition process such as Metalorganic Chemical Vapor Deposition (MOCVD) or Molecular Beam Epitaxy (MBE). Typically, these structures may include the following layers on an InP substrate: p-doped InP buffer layer; p-doped InGaAs p-contact layer; p-doped InP transition layer; undoped, or not intentionally doped, or even very lightly doped; InGaAs detection layer; n-doped InP layer; and an n-doped InGaAs n-contact layer. The InP substrate may be of the Fe doped kind so that it is semi-insulating (SI) to allow good electrical isolation between desired devices fabricated on the same substrate.

The second structure 14 also may be a succession of layers, deposited by the MOCVD or MBE process on the top surface of structure 12, to form an optical cavity incorporating an active region. Although other types of laser cavities can be fabricated in accordance with the invention, the invention will be described herein in terms of ridge lasers, for convenience. As is typical for solid state ridge lasers, the epitaxial structure 14 includes upper and lower cladding regions formed from a lower index semiconductor material than is used in the central active region. These cladding regions may be formed from InP, for example, while the central active region may be formed with InAlInGaAs—based quantum wells and barriers. A transition layer of InGaAsP may be formed on the top cladding region, followed by a p-doped InGaAs contact layer on the top part of structure 14. The contact layer provides an ohmic contact with a top metal layer which is deposited on the structure 14 for connecting the device to a bias source.

The epitaxial structures 12 and 14 may share some of the deposited layers, so that the interface between the structures is common to both. Alternatively, the dopants in structure 12 may be reversed such that layers with n-dopants are first deposited on the substrate, such as SI-InP substrate. The described layers allow the fabrication in structure 12 of highly sensitive detectors such as p-i-n diode detectors and avalanche photodetectors that will operate in specific wavelength ranges, or bands, and the fabrication of surface or edge emitting lasers in structure 14 which are able to emit light at selected wavelengths.

Figure 2:
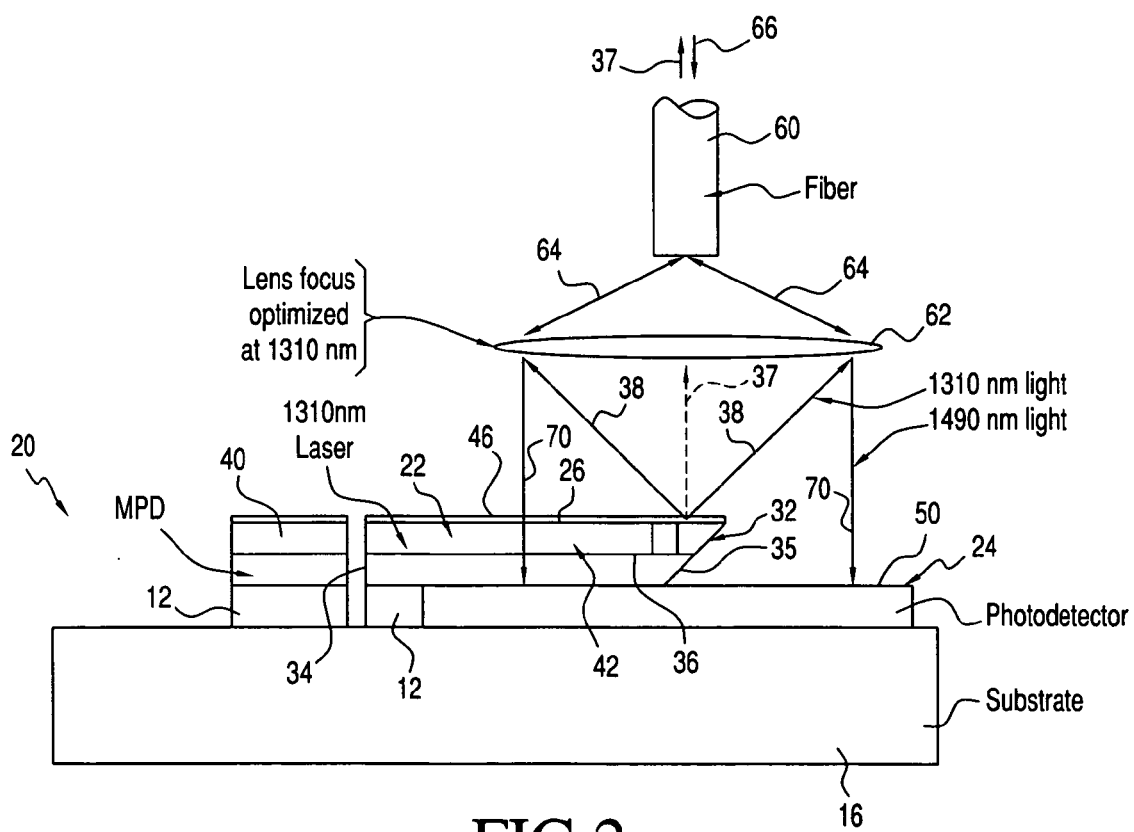
FIG. 2 illustrates a side elevation view of a monolithically integrated photonic device including a surface-emitting laser fabricated in the laser epitaxy, a surface-receiving detector fabricated in the detector epitaxy, and a monitoring photodetector extending through both epitaxial layers of the chip of FIG. 1, in accordance with a first embodiment of the invention.
Figure 3:
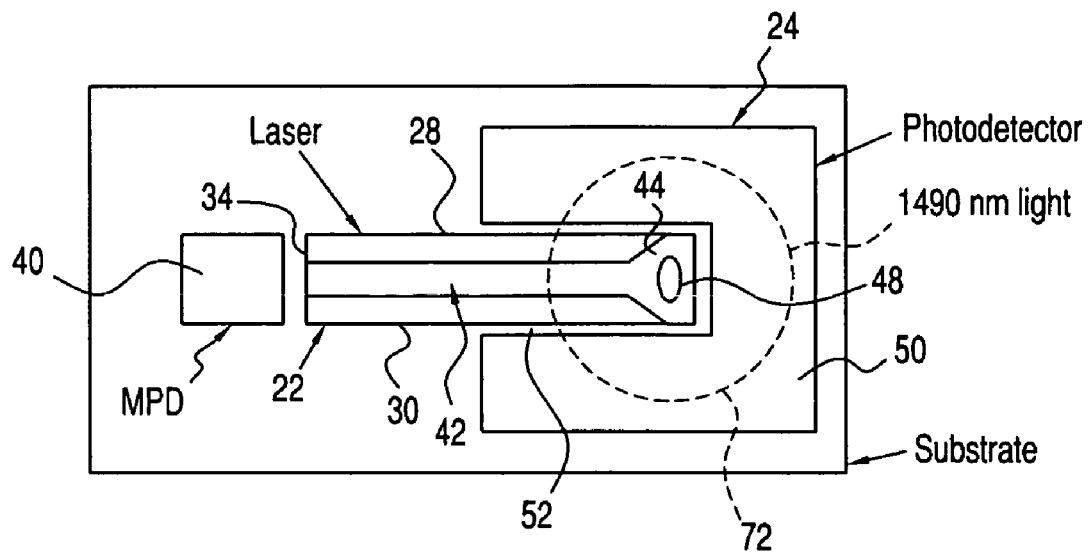
FIG. 3 is a top plan view of the device of FIG. 2.

In a first embodiment of the invention, illustrated in FIGS. 2 and 3, a monolithic photonic device, or chip 20 incorporates an integral laser 22 and an integral detector 24 fabricated monolithically in separate mesas in respective structures 12 and 14 of the chip 10. In order to enhance electrical isolation, in the case of a semi-insulating substrate it is desirable to form the mesas by etching through the epitaxial layers into the substrate. The laser 22 is formed in structure 14 by a conventional masking and etching technique to produce, for example, an HCSEL device including an elongated, horizontal ridge-type optical cavity having a top surface 26, mesa side walls 28 and 30 (see FIG. 3), and first and second ends 32 and 34. An angled, totally internally reflective facet 35 is formed at the first end 32 to direct output light propagated in the active region 36 of the laser 22 upwardly out of the laser optical cavity through a top emissive surface. The second end 34 of the optical cavity is formed by a vertical reflective facet to permit lasing in the optical cavity. The angled facet 35 at end 32 is fabricated by etching the structure 14 downwardly and inwardly at or near a 45° angle with respect to the top surface 26, and causes light generated along the optical axis of the optical cavity to be emitted in a direction that is essentially perpendicular to the surface 26 and to the plane 36 of the active material in the horizontal laser, the emitted light beam traveling upwardly in the direction indicated by arrow 37. The emitted light is dispersed over an angle due to reflections within the cavity, with the limits of the output beam being generally indicated by arrows 38. The laser 22 and photodetector 24 are electrically and optically isolated from one another in this arrangement, as will be further explained below.

The end facet at the second end 34 of the laser is formed at a 90° angle to the longitudinal optical axis of the laser cavity 22. Adjacent this second end of the laser is a monitoring photodetector (MPD) 40, formed in the laser epitaxial structure 14 by a conventional masking and etching process at the same time that the laser optical cavity 22 is masked and etched to form a ridge 42. The ridge laser extends between ends 32 and 34 above the active region 36 in structure 14, with the ridge being widened, as at 44 in FIG. 3, at the emitter end of the laser to provide an open area above the angled facet 35 to allow the emitted beam 37, which may be circular or oval, to exit the optical cavity without distortion. The top of the ridge is coated with an electrically conductive material 46, such as metal, to permit energization of the laser by a suitable bias voltage. This conductive, or metallization layer is typically coated on a top layer of the laser structure, which, as indicated above, may be a low bandgap semiconductor such as InGaAs that allows ohmic contact with the metallization layer. An aperture 48 may be formed in the top layer or layers of structure 14, as needed, to remove material that might absorb the emitted light.

The detector 24 is also fabricated as a part of the masking and etching process that forms the laser 22 and the MPD 40. As illustrated, the portion of structure 14 that overlies the photodetector epitaxy structure 12 around the laser 22 is removed to expose the top surface 50 of the structure 12. The structure 12 is then further etched in the region immediately adjacent and surrounding the laser 22 to form a trench 52 (FIG. 3) that separates the laser 22 from the photodetector structure 12. The trench 52 extends down to, and preferably a short distance into, the substrate 16 to produce separate laser and detector mesas on the substrate. The detector 24 may be further shaped by removing a rearward portion of layer 12 to restrict the detector mesa to the region surrounding the emitting surface above facet 35, as illustrated in FIGS. 2 and 3.

The light output 37 from photonic device 20 may be coupled to an external receiver/source such as an optical fiber 60 by way of a lens 62. Because of chromatic aberrations, such a lens will focus light of a particular wavelength, but will not focus light of a different wavelength. This capability is used in the present invention to cause outgoing light 37 produced by laser 22, which may, for example, be a beam having a wavelength of 1310 nm, to be focused onto the end of fiber 60, as indicated by arrows 38 and 64. Incoming light 66 of a different wavelength than the outgoing light, for example 1490 nm, may be received from the fiber 60, and will be directed to the lens 62, also as indicated by arrows 64. Because of its wavelength, this received light is not tightly focused by the lens 62, as indicated by beam limit arrows 70. As a result, the incoming light is not focused on the emitter end of laser 22, but instead is spread out and impinges on the top surface of detector 50 in the region 72 illustrated by dashed lines in FIG. 3. The preferred design of the laser and detector mesas serves to position the emitter region of the laser essentially in the center of the detector 50 but separated from it by trench 52.

Even if the incoming light 66 is substantially the same wavelength as the outgoing light 37, for example both at about 1310 nm, a mismatch in coupling between the laser and a fiber through a lens makes light detection on the detector 50 possible.

Figure 4:
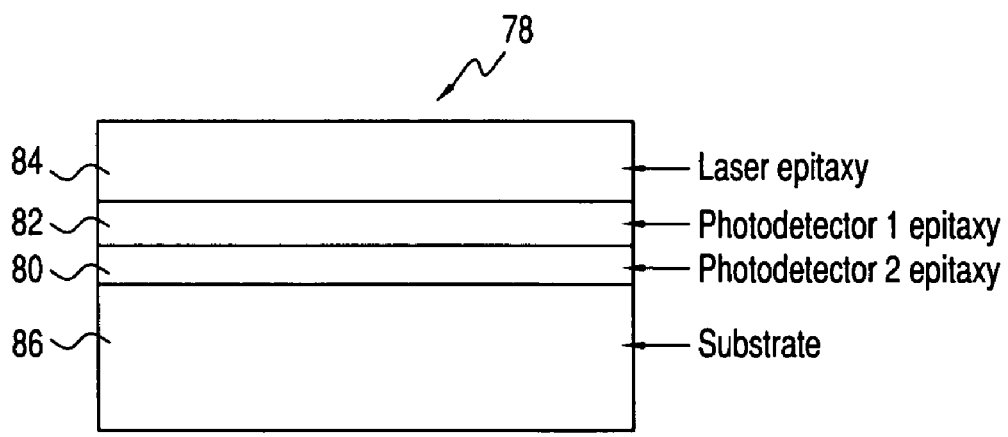
FIG. 4 illustrates a three-layer epitaxial chip structure including a epitaxial laser structure and two detector epitaxial structures on a substrate.

A second embodiment of the invention is illustrated in FIG. 4, wherein a chip 78 includes three epitaxial layers, or structures, detectors 80 and 82 and laser 84, which are fabricated on a substrate 86. Layer 84 is fabricated, as discussed above with respect to FIG. 2 to incorporate an active region in a plane parallel to the top surface of the substrate, while the layers 82 and 80 are fabricated with different bandgaps to form optical detectors responsive to light of selected wavelengths. These semiconductor structures may share common layers to facilitate the fabrication of the device. For example, a highly doped semiconductor layer can be introduced between detector layers 80 and 82 to provide a ground plane to improve electrical isolation and high speed performance.

A monolithically integrated photonic device 90, illustrated in FIG. 5, may be fabricated from chip 78 in the manner described above with respect to the device of FIGS. 2 and 3. In this case, an HCSEL laser waveguide, or cavity 92 is fabricated, in laser structure 84, as by masking and etching with the etching forming a trench such as the trench 52 in FIG. 3, extending downwardly through both detector structures 80 and 82 to the top of substrate 86, so that the laser 92 and the surrounding detectors are located on separate mesas. An emitter end of the laser 92 is etched to form an angled facet 94 which reflects light propagating in the laser upwardly and out of the top surface of the laser. The emitted light beam 96, which may diverge as indicated by limit arrows 98, is directed upwardly to a lens 100, which collects and focuses the light on an input/output device 102 such as an optical fiber, as indicated by arrows 104.

The laser structure, or layer, 84 is removed from the top surface 110 of the detector structure 82 during the formation of laser 92 to shape and expose the top surface of the surface-receiving detector layers 80 and 82 in the region surrounding the emitter end of the laser. An input light beam 114 received by the photonic device 90 from fiber 102 is of a different wavelength than that of the emitted beam 96, and accordingly will not be focused by the lens 100 back to facet 94, but will be directed by the lens onto the surface 110 of detector structure 82, as illustrated by arrows 114, and as described with respect to FIGS. 2 and 3. The detector structure 82 is responsive to the wavelength of this received beam to produce a suitable output by way of an electrode (not shown) connected to detector 82. In addition, the photonic device 90 can respond to a second input beam 116 of still another wavelength supported by fiber 102. This second input beam will also be directed by lens 100 onto the top surface 110 of detector structure 82, as indicated by arrows 116, but this detector structure 82 is not responsive to it. Instead, the light of the second beam passes through structure 82 to the underlying detector structure 80, which receives the beam, as indicated by the arrows 116, and responds to it to produce a corresponding output on a suitable electrode (not shown).

The photonic device 90, which may be referred to as a triplexer, may emit light having a wavelength in the range of 1310 nm±40 nm, for example, while the bandgaps of the detector layers 80 and 82 may be selected so that detector 80 responds to light having a wavelength in the range of 1550 nm±10 nm, and detector 82 receives light in the range of 1490 nm±10 nm. To do this, the bandgap of detector 82 may be selected to detect light below 1520 nm so that light having longer wavelengths will pass through it to the underlying detector structure 80. The detector structure 80 may be either a broadband detector or a detector having a bandgap optimized to receive light having a wavelength below 1580 nm. This detector structure also can be used to provide improved optical isolation between the laser 92 and detector 80 by using detector 82 to block unwanted light from the laser 92, preventing such light from reaching detector 80. For example, if the laser is emitting light at a wavelength of 1310 nm±40 nm, the undoped, or not intentionally doped, or even very lightly doped, detection layer in detector 82 would have a bandgap, form through InGaAsP, designed to capture light of wavelengths shorter than 1350 nm over the temperature range of operation for device 90, and this would prevent the laser output from reaching detector 80. However, in this example, if the wavelength of incoming light 116 is around 1490 nm±10 nm, then it would travel through detector 82 without being detected, and would reach detector 80 where it would be detected. The bandgap of the undoped, or not intentionally doped, or even very lightly doped, detection layer of detector 80 could be formed from InGaAs for this scenario.

Figure 7:
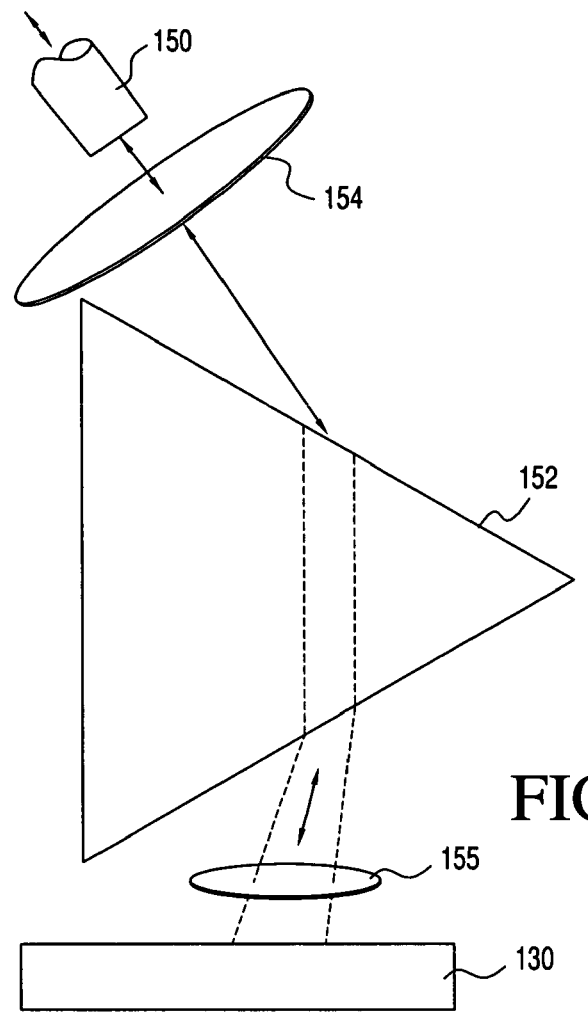
FIG. 7 is a side elevation of the device of FIG. 6 combined with an external prism and lens for optically coupling the lasers and detectors on the chip to an optical fiber.

Although the above-described embodiments show a single laser emitter location and a single detector location surrounding the laser emitter, it will be apparent that the integral photonic device of the invention may incorporate multiple laser locations and multiple detector locations on a single chip, as illustrated, for example, in the top plan view of FIG. 6. In this figure, a photonic chip 130 incorporates an array 132 of horizontal cavity surface-emitting lasers, such as HCSEL lasers 134, 136, 138 and 140, fabricated in an epitaxial laser structure, as described above. The lasers are illustrated as forming generally parallel light emitting channels, although other chip architecture designs can be used. Preferably, emitter surfaces 142, 144, 146 and 148, respectively, of the HCSEL lasers are grouped together for convenience in directing their output beams upwardly to a common input/output optical fiber 150, illustrated in FIG. 7, by way of suitable external optics such as a prism 152 and lenses 154 and 155.

The chip 130 may include surface-receiving detectors fabricated around the emitting ends of each of the lasers to receive light from fiber 150, in the manner described above with respect to FIGS. 1-5. Alternatively, and as illustrated in FIG. 6, an array 160 of surface-receiving detectors 162, 164, 166 and 168 may be provided at a location adjacent to the emitters and grouped for convenience in receiving input light from the input/output fiber 150. Here again, the surface architecture of the chip may be varied from that illustrated in the figure.

As illustrated, an MPD device may be provided to monitor each of the lasers on chip 130, as illustrated at 172, 174, 176 and 178, and suitable bonding pads 180 and ground lines 182 may be provided on the surface of chip 130 as required, in known manner. As in prior embodiments of the invention, the lasers 132 are monolithically fabricated in a first epitaxy structure, while the detectors are fabricated in a second epitaxy structure on a common substrate. Each laser in the array 132 may be fabricated to emit light in a different wavelength band; for example, the surface-emitting lasers 134, 136, and 140 may emit light at wavelengths of 1470 nm, 1490 nm, 1510 nm, and 1530 nm, respectively. Similarly, the detectors 162, 164, 166, and 168 may detect light at respective wavelength bands of 1550 nm, 1570 nm, 1590 nm, and 1610 nm, for example.

In order to have large wavelength variations between the several lasers in array 132, for use in applications such as coarse wavelength division multiplexing (CWDM) where the channel spacing between adjacent CWDM channels is about 20 nm, the active region of the laser structure, which is the first, or top, epitaxy structure as described above, needs to have its bandgap modified so as to allow lasers with appropriate wavelengths to be fabricated for the laser array. This is done by one of many known processes for forming the first epitaxial structure; for example by impurity-free vacancy diffusion or by multiple epitaxial depositions.

The monolithically integrated emitters and detectors of the invention may also be fabricated as edge-emitting lasers (EEL) with surface-receiving detectors, in the manner illustrated in FIGS. 8-15, to which reference is now made. As illustrated in the side view of FIG. 8, such a laser/detector chip 200 preferably includes an edge-emitting laser 202 which may be, for example, a Fabry-Perot (FP) laser fabricated in an epitaxial laser layer 204, and a surface-receiving detector 206 fabricated in an epitaxial detector layer 208, both formed on a substrate 210. The laser and the detector preferably are formed by masking and etching techniques as described above, with the difference that in this configuration a reflective base element 212 is provided adjacent the laser and aligned with its optical axis, but spaced from an emitter facet 214 at one end of the laser 202. Since this is an edge-emitting laser, the facet 214 is perpendicular to the surface of the substrate 210.

Figure 8:
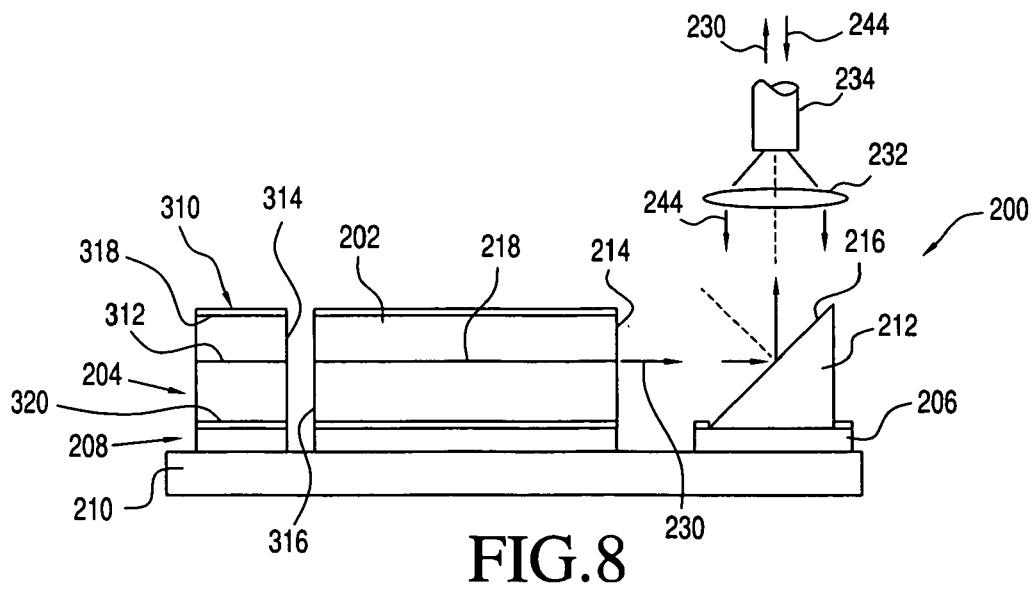
FIG. 8 is a side elevation of a monolithically integrated photonic device incorporating an edge-emitting laser fabricated in the laser epitaxial structure and a surface-receiving detector fabricated in the detector epitaxial structure of the chip of FIG. 1, and incorporating a deflector for redirecting laser edge-emitted light in accordance with another embodiment of the invention.
Figure 9:
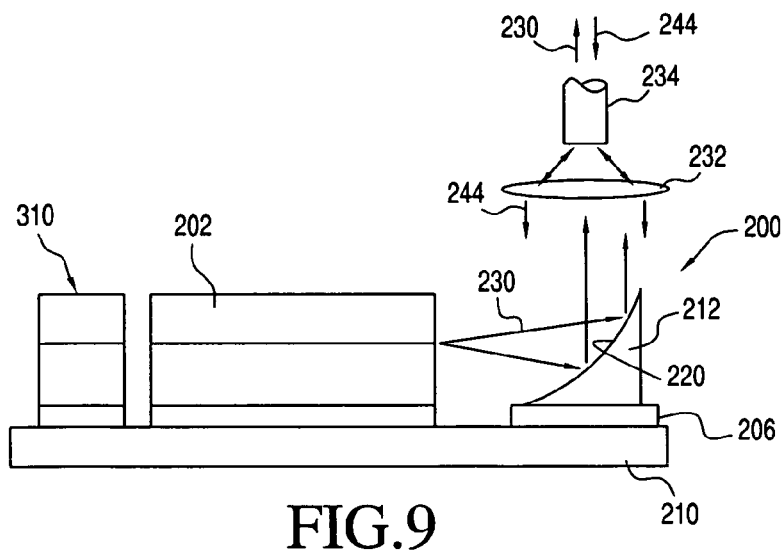
FIG. 9 is a side elevation of a modified form of the device of FIG. 8, incorporating a deflector having a curved surface.
Figure 10:
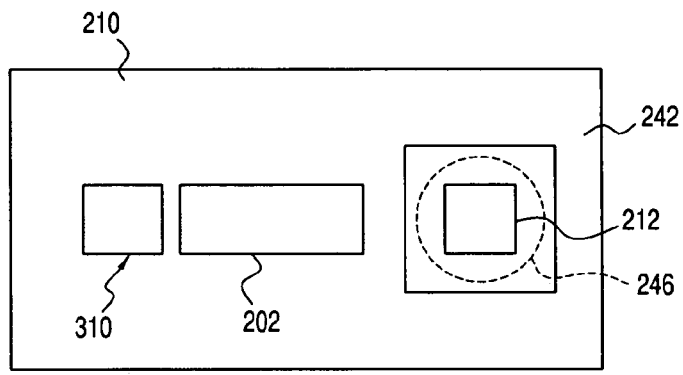
FIG. 10 is a top plan view of the device of FIG. 9.

Base element 212 may include a flat reflective surface 216 aligned with the optical axis 218 of laser 202 at its active region, as illustrated in FIG. 8, or may include a curved reflective surface 220 aligned with axis 218, as illustrated in FIG. 9. A light beam 230 emitted by facet 214 of laser 202 is deflected by surface 216 or by surface 220 through suitable external optics such as a lens 232 to an optical fiber 234. The base element 212 and the surfaces 216 and 220 may be fabricated by lithography and etching of the semiconductor laser and photodetector layers. As illustrated in FIG. 10, the detector layer 206 is shaped, as by etching, to surround the base element 212, so that light 244 received from the optical fiber 234 will be directed by lens 232 onto the surface of the detector in the region indicated by dotted line 246 (FIG. 10), in the manner described above with respect to FIGS. 1-5.

The base element 212 alternatively may be fabricated by electron beam deposition of, for example, silicon, through a lift-off process, to provide a convenient structure on top of the detector layer 206 for reflecting the output of the EEL 202 in a direction perpendicular to the surface of the chip.

Figure 11:
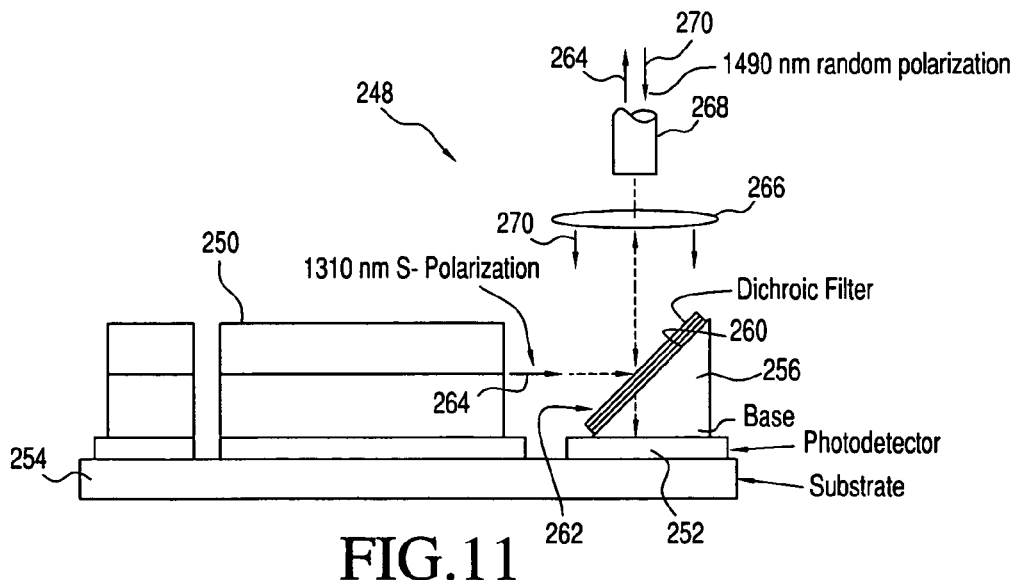
FIG. 11 is a side elevation of a modified form of the photonic device of FIG. 8, wherein the deflector includes a dichroic coating which reflects light emitted by the laser and which passes light received from an external source through the body of the deflector to an underlying detector structure.
Figure 12:
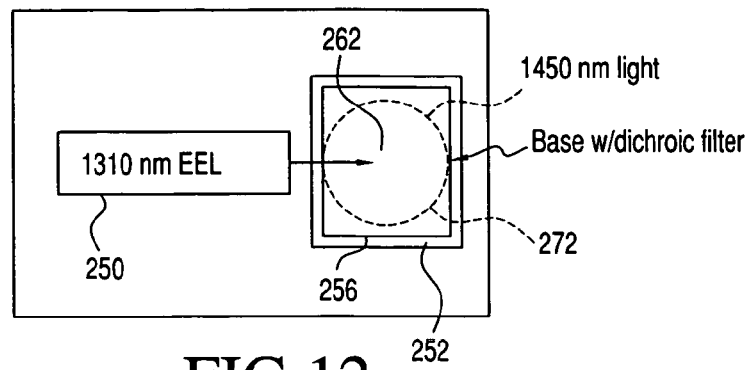
FIG. 12 is a top plan view of the device of FIG. 11.

Another alternative is illustrated in the photonic device 248 of FIG. 11, wherein an edge-emitting laser 250 is integrated with a surface-receiving photodetector 252 on a substrate 254, with a reflective base element 256 mounted on the surface of, or positioned above, the surface of the detector. The base element 256 includes a surface 260 which may be either flat or curved, and a dichroic filter 262 on surface 260. The filter may be a multilayer coating on the surface 260 that is designed to reflect one wavelength band and to allow another wavelength band to pass through. For example, a beam 264 emitted from facet 266 of laser 250 may have a wavelength band of 1310 nm±40 nm and may be essentially s-polarized. The beam 264 is directed onto the surface of filter 262, which is at an angle of 45° to the optical axis of the laser, and will be almost completely reflected upwardly through external optics 266, such as a lens, to an optical fiber 268. Incoming light 270 directed from the optical fiber toward the photonic device 248 may have a wavelength band of 1490 nm±10 nm, for example. This light is also directed at an angle of 45° to the filter 262, but light at this wavelength is almost completely transmitted through the filter and passes through base 256 to the detector 252. As illustrated in the top view of FIG. 12, the received light 270 is directed onto the portion of the photonic detector 252 that is within the dotted line 272. This includes the region beneath the base element 256 to provide a greater area of detection, and thus greater sensitivity to received light.

Figure 13:
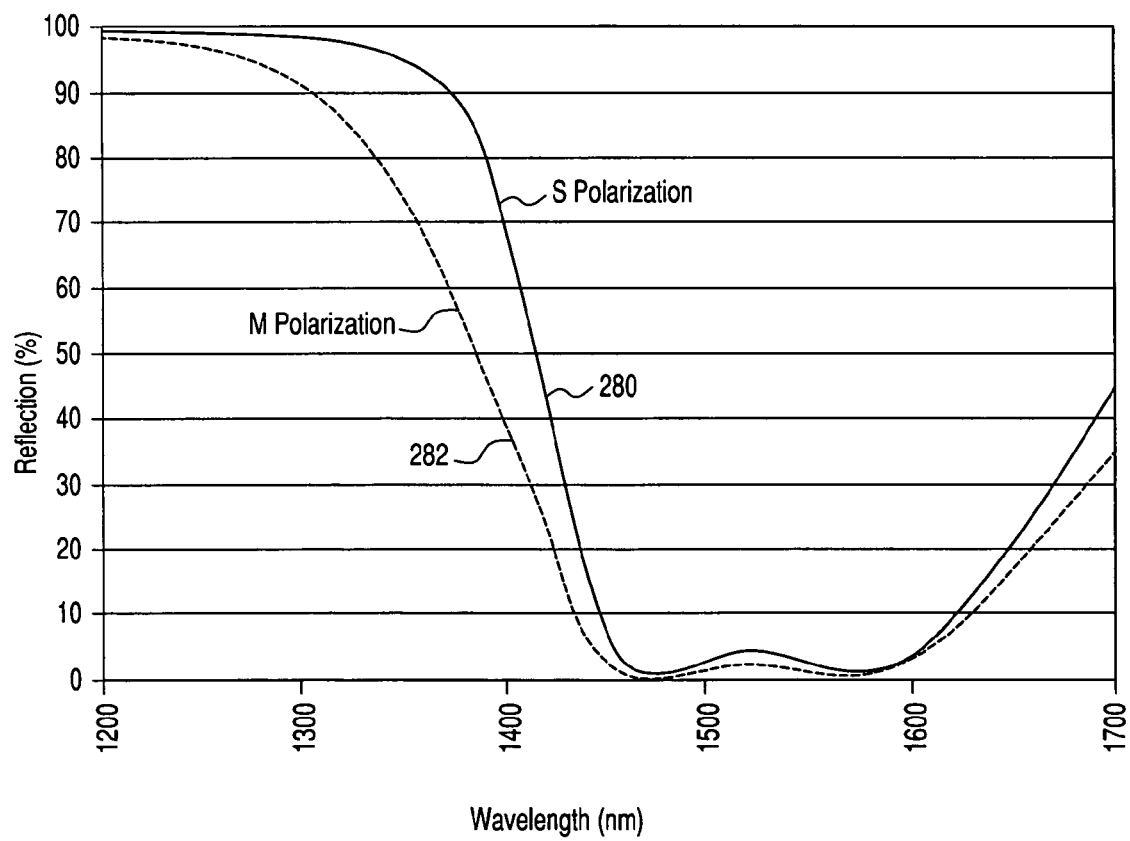
FIG. 13 is a graph of the reflection characteristics of an example of a dichoric filter for the device of FIG. 11.

The reflection versus wavelength behavior of a typical dichroic filter is illustrated in FIG. 13 by curves 280 and 282. In this case, the base element was InP and the outside medium was air, and nine layers were used to fabricate the filter using conventional design techniques.

Figure 14:
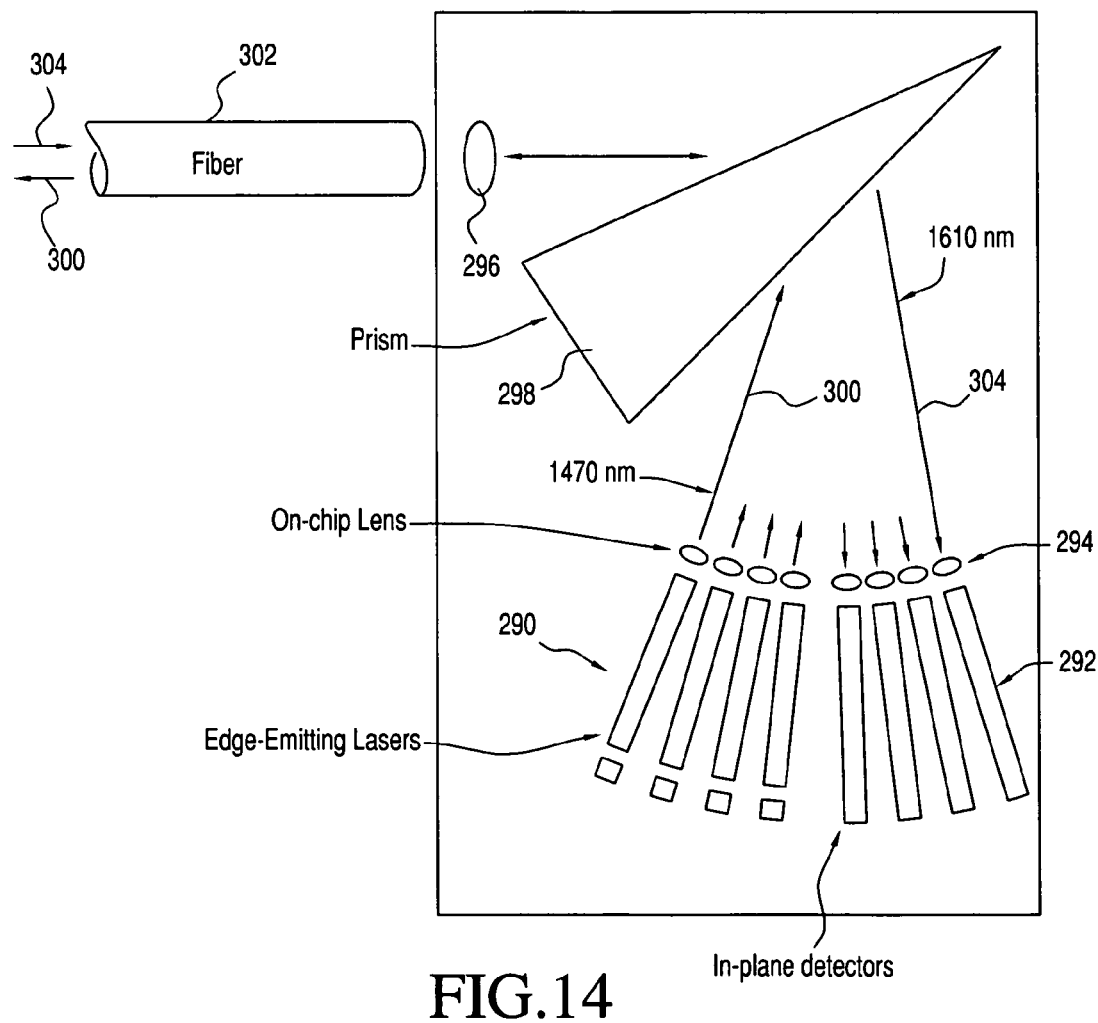
FIG. 14 is a top plan view of a monolithically integrated photonic device incorporating an array of edge-emitting lasers and edge-receiving detectors coupled to an external optical fiber through a prism.
Figure 15:
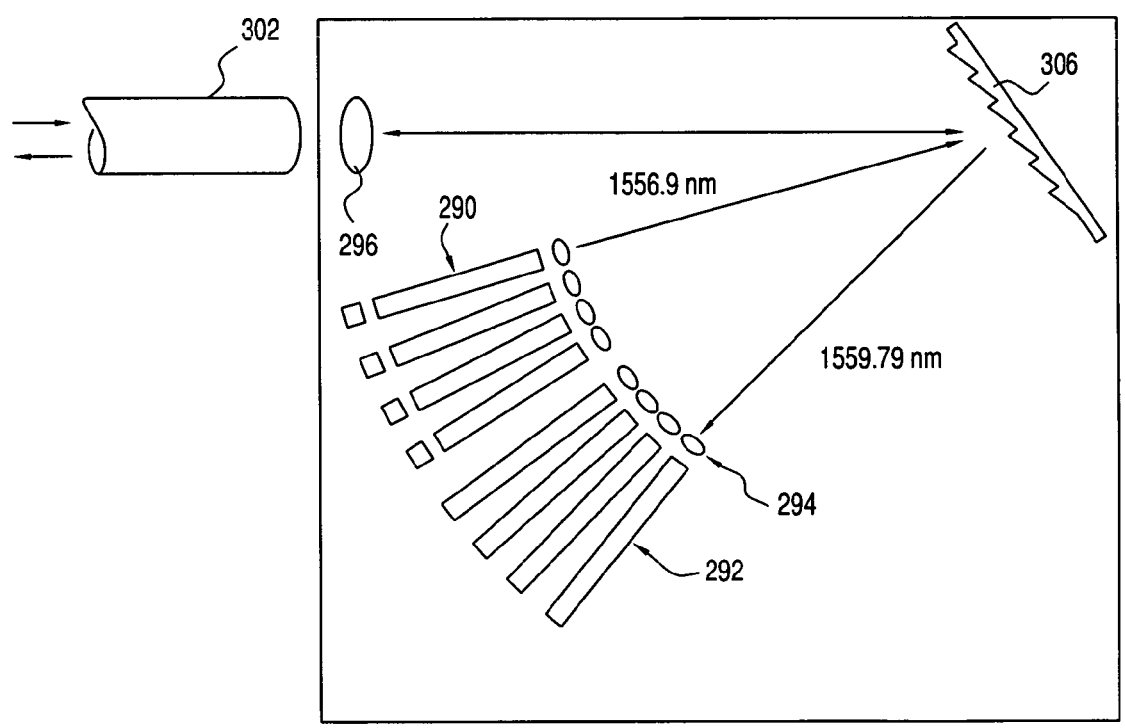
FIG. 15 is a top plan view of a monolithically integrated photonic device incorporating an array of edge-emitting lasers and edge-receiving detectors coupled to an external optical fiber by way of a grating.

FIGS. 14 and 15 illustrate arrays of edge-emitting lasers and edge-receiving detectors integrated on chips with on-chip optical elements such as lenses and prisms. In FIG. 14, an array 290 of edge-emitting lasers and an array 292 of edge-receiving detectors are fabricated in respective epitaxial laser and detector structures on a common substrate. On-chip lenses 294 and 296 and prism 298 are fabricated in alignment with the optical axes of the lasers and detectors in the arrays 290 and 292, using the process described in U.S. Pat. No. 6,653,244, to direct light 300 emitted from the lasers to an optical fiber 302. The optical elements similarly direct received light 304 from fiber 302 to the detectors of array 292. Alternately, the on-chip prism 298 is replaced by an on-chip grating 306 to allow for a larger degree of dispersion for closely-spaced wavelengths, as illustrated in FIG. 15. Other arrays of closely-spaced laser channels for different light wavelengths may be formed on the same first epitaxial structure by modifying the architecture of the chip.

Figure 16:
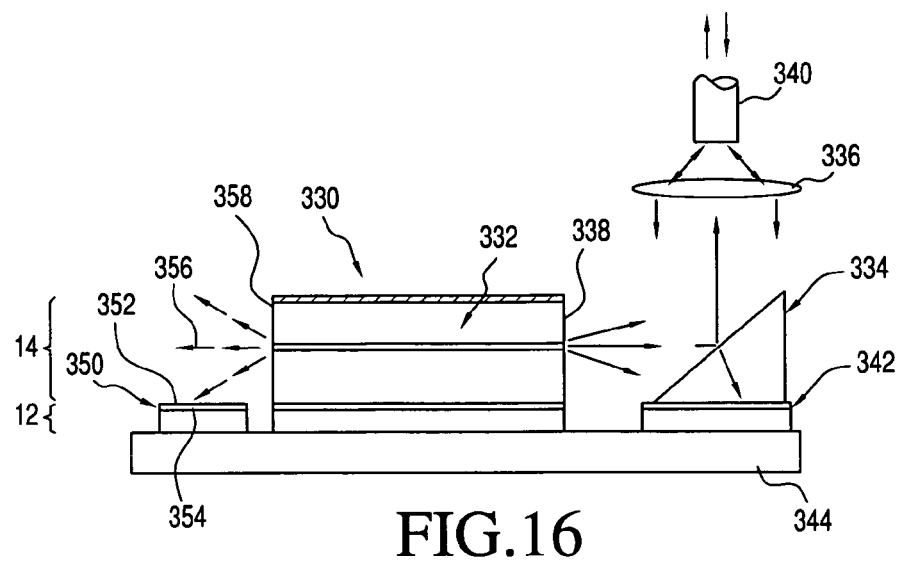
FIG. 16 is a side elevation of a photonic device such as that of FIG. 8, modified to incorporate a surface-receiving monitoring photodetector (MPD) fabricated in the detector epitaxial structure.

FIG. 16 illustrates a modified from of the photonic devices described above. In each of the foregoing devices, a monitoring photodetector (MPD) is illustrated at one end of the laser cavity in alignment with the optical axis of the laser, and monolithically fabricated from the same material as the laser. Thus, for example, in each of the device of FIG. 8 an MPD 310 is fabricated in the laser epitaxial layer 204. As illustrated, the monitoring photodetector incorporates an active region 312 aligned with the active region of the laser at the optical axis 218, and is fabricated in layer 204 by the lithography and etching process used to fabricate the laser 202. Accordingly, the MPD incorporates an etched facet 314 spaced from and substantially parallel to the rear etched facet 316 of the laser. Although rear facet 316 is usually highly reflective in order to produce lasing in the laser cavity 202, some light is emitted, and impinges on facet 314. Such light is detected by the MPD device 310, to produce a corresponding output on a suitable electrodes (not shown) connected to contact layers 318 and 320. As illustrated, the MPD device is fabricated by vertically etching through both the laser epitaxial layer 204 and the detector epitaxial layer 208 to isolate the MPD from the laser, as illustrated in the top plan view of FIG. 10. As shown in FIG. 8, in order to prevent absorption of incoming light from the fiber 224 in the contact layer 320, this layer has been removed from underneath the base element 212.

In the embodiment of FIG. 16, a photonic device 330 incorporates a laser 332 fabricated in a laser epitaxial layer, such as layer 14 of the chip structure 10 illustrated in FIG. 1, by the lithography and etching process describe above. This laser may be a surface-emitting laser, such as those illustrated in FIGS. 2, 3, 5, and 6, or an edge-emitting laser, such as those illustrated in FIGS. 8-12, 14, and 15, and may incorporate any desired optical system, such as deflector 334 and lens 336 for example, for transferring light emitted from the laser, as from facet 338, to an external optical system, such as an optical fiber 340. The photonic device may incorporate a monolithic detector at the emitter end of the laser, such as the detector 342, for example, when utilized in a monolithic laser-detector photonic device on a common substrate 344, as has been describe above.

In accordance with the embodiment of FIG. 16, the MPD illustrated in previous embodiments is modified to utilize the detector epitaxial layer 12 (FIG. 1) for monitoring the operation of the laser 332 instead of using the laser epitaxial layer 14. As illustrated, the photonic device 330 incorporates an MPD 350 that is fabricated as a mesa in the detector epitaxial layer 12 by etching away the laser epitaxial layer 14 to expose the top surface 352 of the layer 12. This top surface is at the active p-i-n region 354 of layer 12, which is sensitive to impinging light to produce an electrical output signal on a suitable electrode (not shown) connected to the MPD 350. This configuration is capable of detecting the small amount of light, indicated by arrows 356, emitted from the rear facet 358 of the laser. This light diverges, as illustrated, but sufficient light strikes the top surface 352 of MPD 350 to permit effective monitoring of the intensity of the light produced by laser 332.

Figure 17:
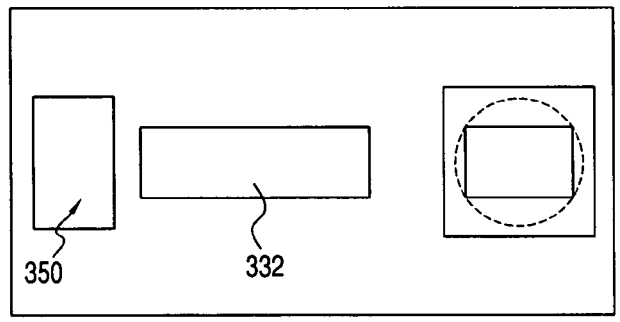
FIG. 17 is a top plan view of the device of FIG. 16.

When the MPD is fabricated, an etch is used to remove the laser layer 14 over the top surface area 352 and to remove the detector epitaxial layer 12 around the periphery of the MPD so as to isolate it from the laser, as illustrated in FIG. 17. Preferably, this etching step takes place concurrently with the etching of laser 332, deflector 334 and detector 342, so that the photonic device is monolithically fabricated on the substrate. The detector 342 and the MPD 350 are both fabricated in layer 12, preferably at the same time, providing two photosensitive surface detectors for the photonic device 330. FIG. 16 shows an alternative technique than that used in FIG. 8, in that the contact layer of the p-i-n region 354 has not been removed from underneath the deflector 334, at the emitter end, but in this embodiment it is kept thin to prevent noticeable absorption of incoming light from the fiber 340.

Figure 18:
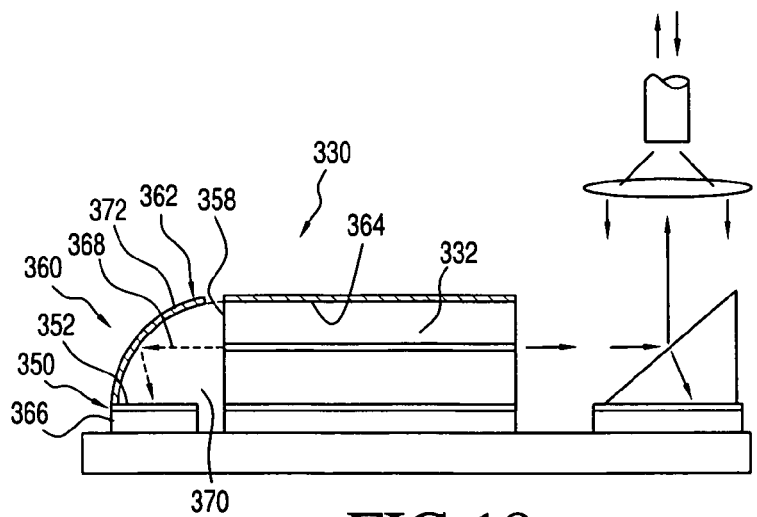
FIG. 18 is a side elevation of a modified form of the device of FIG. 16, incorporating a surface-receiving MPD with a light-deflector hood.

A more sensitive MPD for the photonic device 330 of FIG. 16 is illustrated at 360 in FIG. 18, wherein similar elements are similarly numbered. In this modification, a hood 362 is provided for the MPD 350 to protect the p-i-n active region 354 and to direct more of the light emitted from facet 358 onto surface 352. The hood is curved and extends from near the top surface 364 of the laser structure 332 to near the most distant edge 366 of the MPD 350, with the curvature being concave to the MPD surface to direct the emitted light, as illustrated by dotted arrow 368.

The hood is fabricated from, for example, polyimide 370, such as Photoneece™ PWDC-1000 photosensitive polyimide, which is substantially transparent at the emission wavelength of the laser 332, that is deposited, patterned and cured. During the curing of the polyimide, it rounds off, as illustrated, to produce a continuous curved surface. The surface of the hood is then coated with a metallic layer 372 to provide a reflective concave surface for directing light emitted from facet 358 to the MPD 350. The hood thus directs the emitted light toward surface 352 for detection by the MPD 350, providing a sensitive monitor for the intensity of the light generated in laser 332. Furthermore, in view of the metalized surface, the hood substantially contains the light emitted from the back facet and prevents it from reaching any unwanted regions on or off the device 330. In order to maintain good electrical Isolation, the metallic layer 372 does not make contact with the laser 332.

Figure 19:
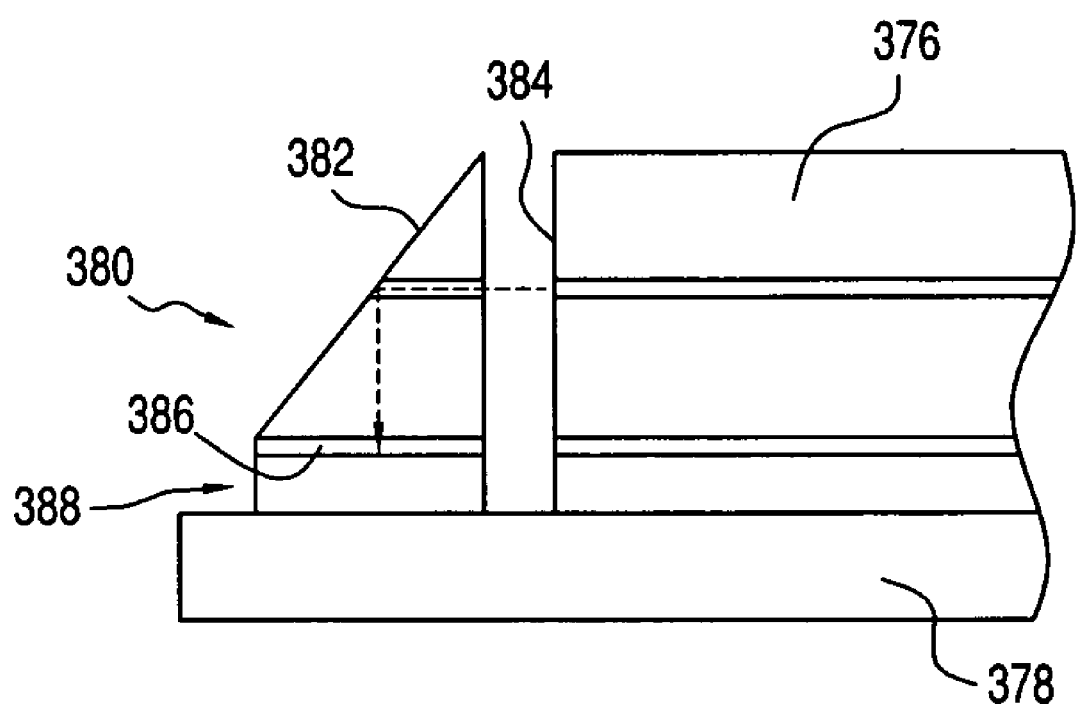
FIG. 19 is a side elevation of another embodiment of the device of FIG. 16.

A modified form of the hood of FIG. 18 is illustrated in FIG. 19, wherein a laser 376 on a substrate 378 is illustrated. The curved hood for the monitoring detector 360 in FIG. 18 is replaced by a deflector 380 having an angled facet 382. In this embodiment, the laser 376 may be an edge-emitting laser or a surface emitting laser, as described above. The deflector 380 is fabricated in the laser epitaxial structure and it, together with a surface-receiving monitoring photo detector are etched as a mesa, as described above with respect to FIGS. 2, 5, 8 or 11, for example. The angled facet 382 is etched at a preferably 45° angle with respect to the surface of the substrate 378, and deflects light emitted from the back facet 384 of the laser, downwardly onto a p-i-n photo detector 388 formed in the detector epitaxy, for detection. A contact layer 386 may be formed from InGaAs of suitable doping, and needs to be thin to allow sufficient light to reach the i-region of the p-i-n photo detector 388.

Figure 20:
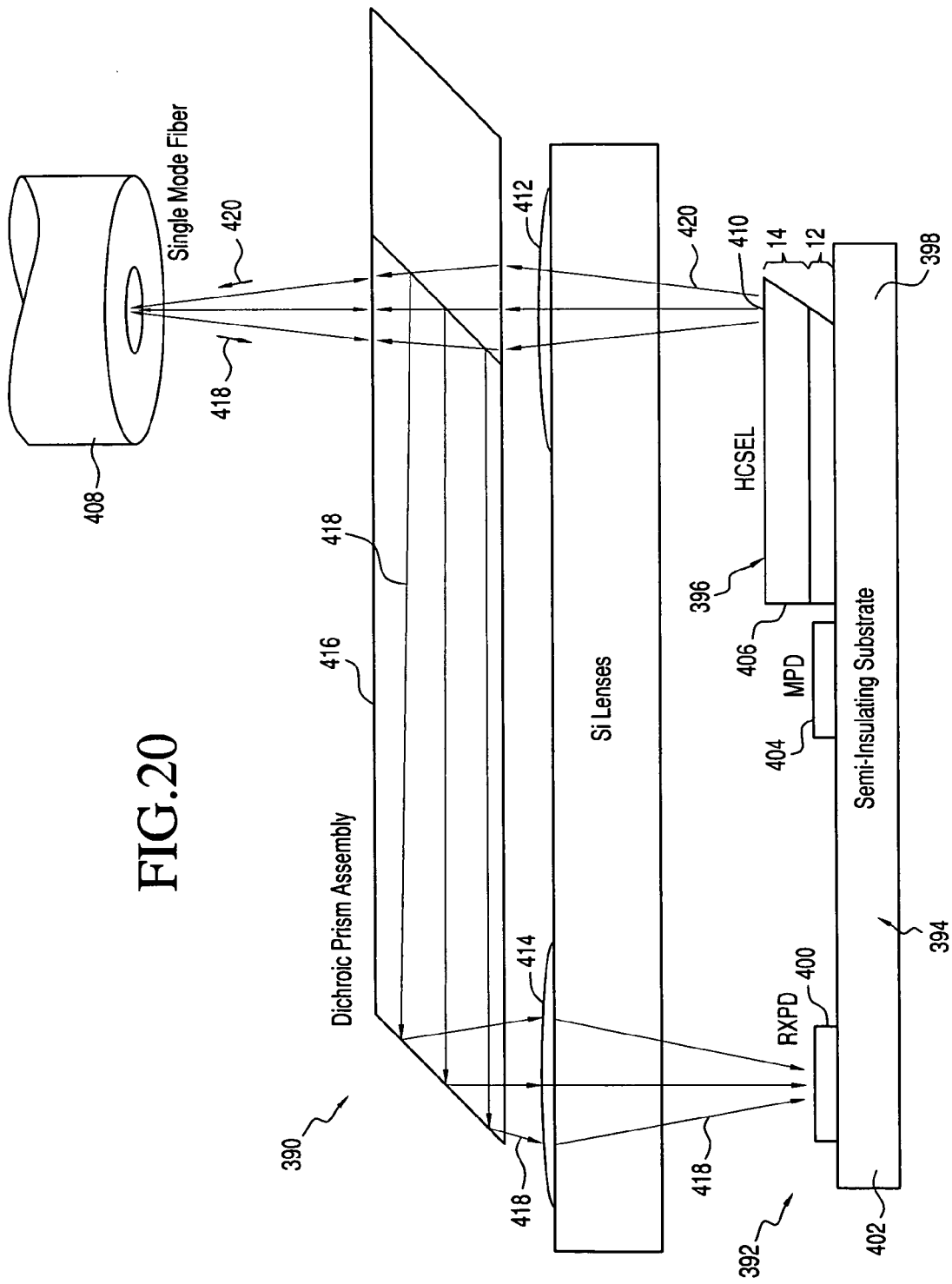
FIG. 20 is a side elevation of a bifurcated chip with external components.

FIG. 20 illustrates another embodiment 390 of the invention in the form of a bifurcated chip 392 including a semi-insulating substrate 394 having a surface-emitting laser 396 at one end 398 of the chip and a surface receiving detector 400 on the other end 402 of the chip. A monitoring photodetector 404 is formed on the substrate 394 to monitor the back facet 406 of the laser. FIG. 20 also illustrates an example of external components that may be used with the bifurcated chip to allow it to receive and emit light into a single fiber such as the single mode optical fiber 408 spaced above the emitter facet 410 of the laser 396. Lenses 412 and 414 spaced above the exit facet 410 and above the detector 400, respectively, are used together with a dichroic prism 416, which is located between the lenses and the fiber 408, to allow light 418 from the fiber 408 to be directed to the surface receiving detector 400, while the laser light 420 is directed from the output facet 410 to the fiber 408. Although lenses based on silicon are shown in FIG. 20, it will be understood that other types lenses can also be used. It will also be understood other types of external components can be used with the bifurcated chip and that the surface-emitting HCSEL laser 396 may be replaced with an edge-emitting laser having suitable reflectors, and/or the surface receiving detector 400 may be replaced with an edge receiving detector, again, with suitable reflectors. The MPD detector 404 is shown as a surface-receiving detector, but it will be further understood that an edge-receiving detector may be used. In addition, a hood such as that illustrated in FIG. 18 may also be used.

Figure 21:
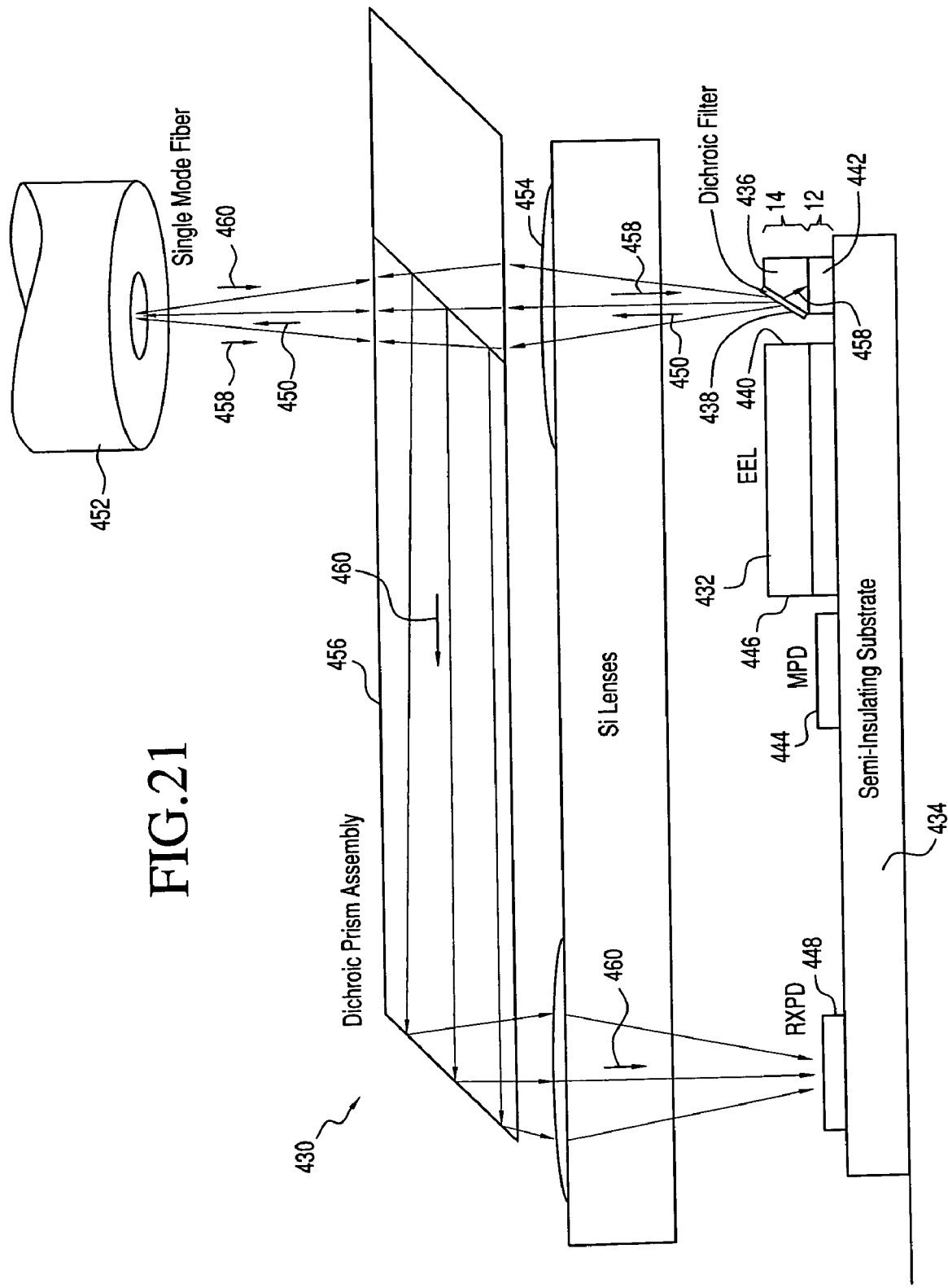
FIG. 21 is a side elevation of a triplexer formed with an integrated photonic chip and external components.

FIG. 21 illustrates at 430 a modified version of the photonic device 390 that includes a third surface-receiving detector and similar external components to that of FIG. 20 to provide the functionality of a triplexer. As illustrated, this embodiment incorporates an edge-emitting laser 432 on a semi-insulating substrate 434, with a reflector 436 having a dichroic filter 438 positioned adjacent an emitter facet 440 and above a detector 442 in the manner described above with respect to the embodiment of FIG. 11. An MPD 444 is located adjacent the back end facet 446 of laser 432, and a remote detector 448 is mounted on the substrate 434 at the end of the substrate distant from the end where the laser emitter is located. Light 450 of a first wavelength emerges from the laser and is coupled to a fiber 452 through lens 454 and one end of prism 456, while light of second and third wavelengths 458 and 460 is directed from the fiber toward device 430. Detector 444 is an MPD and detects light of the first wavelength emitted from the back facet 446 of the laser. The second detector 442 underneath the dichroic coated deflector 436 receives the light 458 of the second wavelength. The dichroic prism 456 of the external components directs the third wavelength 460 towards the third, surface-receive detector 448. The function performed by the photonic device and external components of FIG. 21 is that of a triplexer.

Although the present invention has been illustrated in terms of preferred embodiments, it will be understood that variations and modifications may be made without departing from the true spirit and scope thereof, as set out in the following claims.

What is claimed is:

1. A photonic device comprising:
    a substrate;
    at least first and second epitaxial structures, said first epitaxial structure being a semiconductor laser structure and superimposed on a first portion of said second epitaxial structure and said second epitaxial structure being a semiconductor p-i-n photodetector structure and superimposed on said substrate;
    a trench passing through said second epitaxial structure and separating said second epitaxial structure into said first portion and at least a second portion;
    at least a first etched-facet laser fabricated in said first epitaxial structure, said first etched-facet laser having an etched reflective end facet passing downwardly into said first epitaxial structure but not completely through said substrate, an etched emitter end facet passing downwardly into said first epitaxial structure but not completely through said substrate, and an optical axis extending between said reflective end and said emitter end; and
    at least a monitoring photodetector fabricated in said second portion of said second epitaxial structure to monitor operation of said laser, said monitoring photodetector being positioned adjacent said reflective end facet of said laser and having a horizontal detector surface positioned to detect at least a portion of light being emitted from said reflective end facet of said laser;
    whereby said laser and said monitoring photodetector are monolithically integrated on said substrate.

2. The device of claim 1, wherein said etched facet at said emitter end of said laser is at an angle of about 45 degrees to said optical axis to provide a surface-emitting laser.

3. The device of claim 1, wherein said etched facet at said emitter end of said laser is at an angle of about 90 degrees to said optical axis to provide an edge-emitting laser.

4. The device of claim 1, wherein said laser and said monitoring photodetector are on separate mesas on said substrate.

5. The device of claim 1, wherein a second trench is provided that separates said first portion of said second epitaxial structure from a third portion of said second epitaxial structure, said third portion being positioned adjacent said emitter end of said laser.

6. The device of claim 5, wherein a first receiving photodetector is formed in said third portion of said second epitaxial structure near the emitter end of said laser.

7. The device of claim 6, further including an optical fiber for receiving light emitted by said laser, and for directing incoming light toward said first receiving photodetector.

8. The device of claim 6, wherein said laser emits laser light of a first wavelength; and said first receiving photodetector detects light of a second, different wavelength.

9. The device of claim 8, further including a second receiving photodetector fabricated on top of said first receiving photodetector.

10. The photonic device of claim 9, wherein said second receiving photodetector detects light of a third wavelength that is different from said first and said second wavelengths.

11. The photonic device of claim 10, wherein said first receiving photodetector substantially absorbs light of said second wavelength and is substantially transparent to said third wavelength.

12. The device of claim 1, further including an optical element for coupling light emitted from said reflective end of said laser to said monitoring photodetector.

13. The device of claim 12, wherein said optical coupling element includes a reflector.

14. The device of claim 13 wherein said reflector is a hood comprising a substantially optically transparent material between said laser and said monitoring photodetector, and a reflective coating on said filter.

15. The device of claim 13 wherein said reflector is a 45 degree mirror fabricated in said first epitaxial structure above said monitoring photodetector surface and spaced from said laser reflective end facet by said trench, said mirror directing light emitted by said laser at its reflective end facet between said laser and the surface of said monitoring photodetector.

* * * * *